(12) United States Patent
Kim et al.

(10) Patent No.: US 7,609,078 B2
(45) Date of Patent: Oct. 27, 2009

(54) CONTACT ALIGNMENT VERIFICATION/ADJUSTMENT FIXTURE

(75) Inventors: Kyung Young Kim, Portland, OR (US); David William Newton, Tualatin, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 0 days.

(21) Appl. No.: 11/963,469

(22) Filed: Dec. 21, 2007

(65) Prior Publication Data

US 2009/0160471 A1 Jun. 25, 2009

(51) Int. Cl.
*G01R 31/02* (2006.01)
*G01R 31/26* (2006.01)

(52) U.S. Cl. .................. 324/758; 324/754; 324/765

(58) Field of Classification Search .......... 324/754–765
See application file for complete search history.

(56) References Cited

U.S. PATENT DOCUMENTS

| | | | |
|---|---|---|---|
| 4,739,550 A * | 4/1988 | Schaeffer et al. ............... 29/741 |
| 4,959,609 A | 9/1990 | Prokopp et al. |
| 5,198,756 A * | 3/1993 | Jenkins et al. ............... 324/757 |
| 5,568,870 A | 10/1996 | Utech |
| 5,718,040 A | 2/1998 | Faure et al. |
| 5,842,579 A | 12/1998 | Garcia et al. |
| 6,194,679 B1 | 2/2001 | Garcia et al. |
| 6,600,325 B2 * | 7/2003 | Coates et al. ............... 324/519 |
| 6,764,272 B1 * | 7/2004 | Nuxoll et al. ............... 414/754 |
| 6,906,508 B1 | 6/2005 | Saulnier et al. |
| 7,119,566 B2 | 10/2006 | Kim |
| 7,161,346 B2 | 1/2007 | Fish et al. |
| 7,173,432 B2 | 2/2007 | Garcia et al. |
| 2005/0035778 A1 * | 2/2005 | Lin ........................... 324/758 |

FOREIGN PATENT DOCUMENTS

| | | |
|---|---|---|
| JP | 08-292228 | 11/1996 |
| JP | 08-334547 | 12/1996 |
| JP | 2002-008804 A | 1/2002 |

* cited by examiner

*Primary Examiner*—Ha Tran T Nguyen
*Assistant Examiner*—Emily Y Chan
(74) *Attorney, Agent, or Firm*—Young Basile

(57) ABSTRACT

In an electronic testing machine including at least one test module having a plurality of contacts for testing electronic components, the improvement of a contact alignment tool for aligning the contacts is taught. The tool includes a body to be positioned relative to the machine such that the body can be radially indexed along a path to a test position proximate the contacts and a plurality of circuits associated with the body. Each circuit includes at least one output signal connection and at least one open contact station. Each station is defined by at least one open circuit trace pattern and is closed by the contacts when the body is located at the test position and the contacts are properly aligned. A method and apparatus for aligning contacts of an electronic testing machine are also taught.

22 Claims, 4 Drawing Sheets

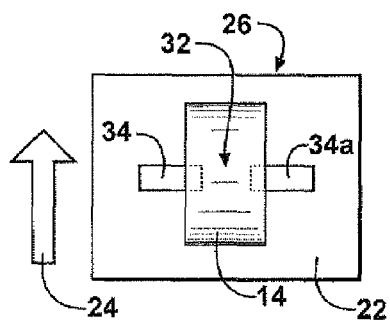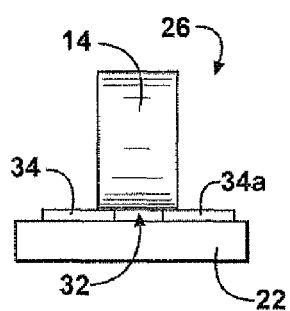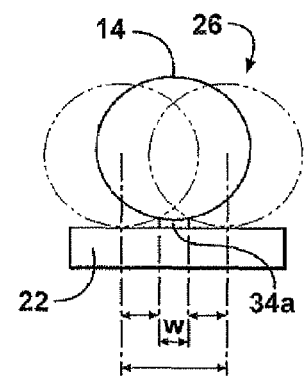
FIG - 3A  FIG - 3B  FIG - 3C
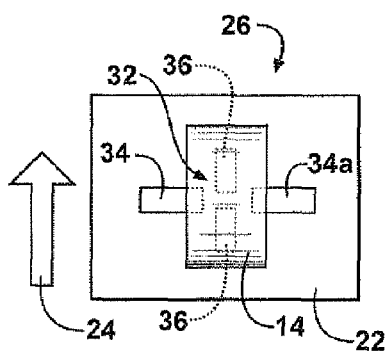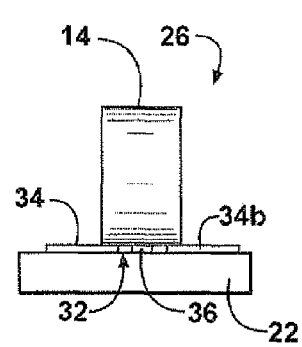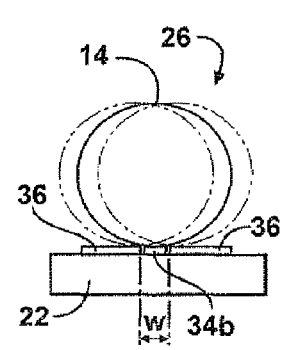
FIG - 4A  FIG - 4B  FIG - 4C
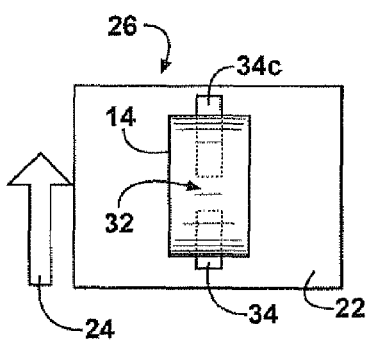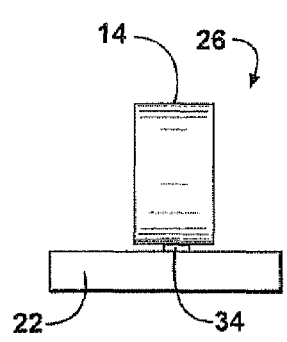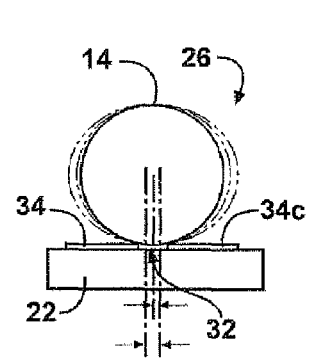
FIG - 5A  FIG - 5B  FIG - 5C

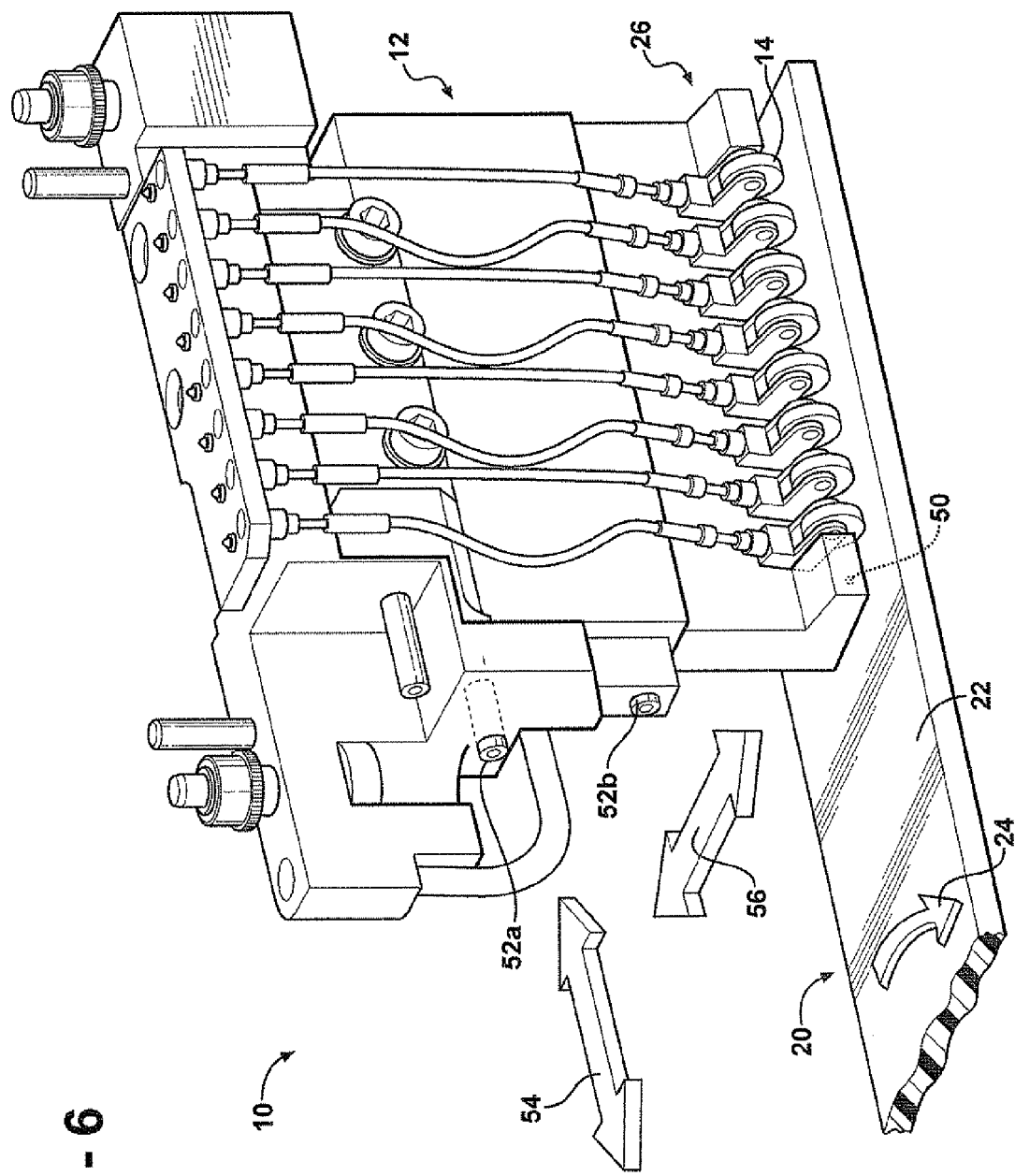

CONTACT ALIGNMENT VERIFICATION/ADJUSTMENT FIXTURE

FIELD OF THE INVENTION

The present invention relates to a fixture for verifying and/or adjusting alignment of contacts in an electronic testing machine having at least one test module with a plurality of test contacts for testing electronic components, such as multi-layer ceramic capacitors.

BACKGROUND

Parametric testing of Multi-Layer Ceramic Capacitors (MLCC) requires precise alignment of the Device Under Test (DUT) contacts to ensure accurate measurements. MLCC DUTs are typically loaded into an automated test fixture with multiple upper and lower contacting terminals. A set of adjustable contact terminals is positioned opposite a fixed set with the DUTs confined within the middle of the contacts. Contact alignment gets more critical as manufacturing processes move to smaller DUT geometries and more devices are simultaneously tested to reach higher manufacturing throughput goals. An easy to use tool is desired to quicken the alignment process during initial setup and machine verification.

Presently known alignment procedures use visual aids such as borescopes (a long, thin, flexible/rigid optical magnifier with light source) to view in situ DUTs. The DUTs and corresponding contacts are simultaneously viewed while the DUT is held at an indexed position. Wide DUT spacing allows the borescope to view all adjustable contacts. Adjustments are then made to the contact and the process is repeated for adjustment verification. However, congested DUT spacing prohibits borescope use for the innermost contacts and alignments are assumed until actual part testing is performed.

SUMMARY

In an electronic testing machine including at least one test module having a plurality of contacts for testing electronic components, an improvement of comprises a contact alignment tool for aligning the contacts including a body to be positioned relative to the testing machine such that the body can be radially indexed along a path to a contact alignment test position proximate the contacts of the test module, and a plurality of circuits associated with the body, each circuit including at least one output signal connection and at least one open contact station, each open contact station defined by at least one open circuit trace pattern, such that each open contact station will be closed by the contacts when the body is located at the contact test position proximate the contacts and the contacts are properly aligned.

A contact alignment tool for aligning test contacts in an electronic testing machine including at least one test module having a plurality of contacts for testing electronic components is also taught. The contact alignment tool includes a body to be positioned relative to the testing machine such that the body radially indexes along a path to a contact alignment test position proximate the contacts of the test module and includes a plurality of circuits associated with the body, each circuit including at least one output signal connection and at least one open contact station, each open contact station defined by at least one open circuit trace pattern, such that the open contact station will be closed by the contacts when the body is located at the contact alignment test position proximate the contacts and the contacts are properly aligned.

The disclosure also describes a method for aligning contacts of an electronic testing machine including at least one test module having a plurality of contacts, the method including attaching a body relative to the testing machine, the body including at least one open contact station having at least one trace pattern extending between an output signal connection, by way of example and not limitation, such as a light emitting diode, and a power source, indexing the body along a path to a contact alignment test position proximate the at least one test module having a plurality of contacts to be tested, and in the event that the output signal connection is not energized, such as the light emitting diode does not illuminate, when the body is indexed to the contact alignment test position proximate the at least one test module having the plurality of contacts to be tested, adjusting alignment of the at least one test module having the plurality of contacts to be tested so that the output signal connection is energized, by way of example and not limitation, the light emitting diode illuminates.

Other applications of the present invention will become apparent to those skilled in the art when the following description of the best mode contemplated for practicing the invention is read in conjunction with the accompanying drawings.

BRIEF DESCRIPTION OF THE DRAWINGS

The description herein makes reference to the accompanying drawings wherein like reference numerals refer to like parts throughout the several views, and wherein:

FIGS. 3A-3C are plan, elevational, and side views of roller alignment pattern geometry for a rough degree of precision;

FIGS. 4A-4C are plan, elevational, and side views of roller alignment pattern geometry for a medium degree of precision;

FIGS. 5A-5C are plan, elevational, and side views of roller alignment pattern geometry for a fine degree of precision;

FIG. 6 is a simplified schematic diagram illustrating radial adjustment and theta adjustment of a contact versus indexing movement of the fixture.

DETAILED DESCRIPTION

Referring briefly to FIG. 6, an electronic testing machine 10 is illustrated including at least one test module 12 having a plurality of contacts 14 for testing electronic component 16

Figure 1:
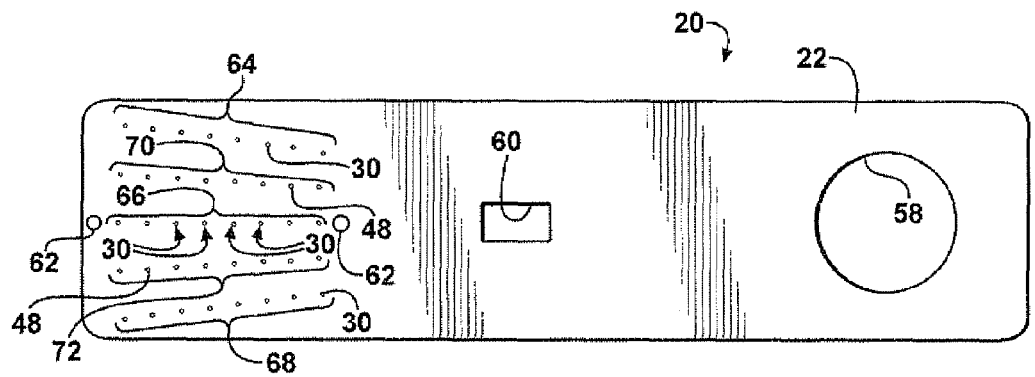
FIG. 1 is a plan view of a contact alignment verification/adjustment fixture according to one embodiment of the invention.
Figure 7:
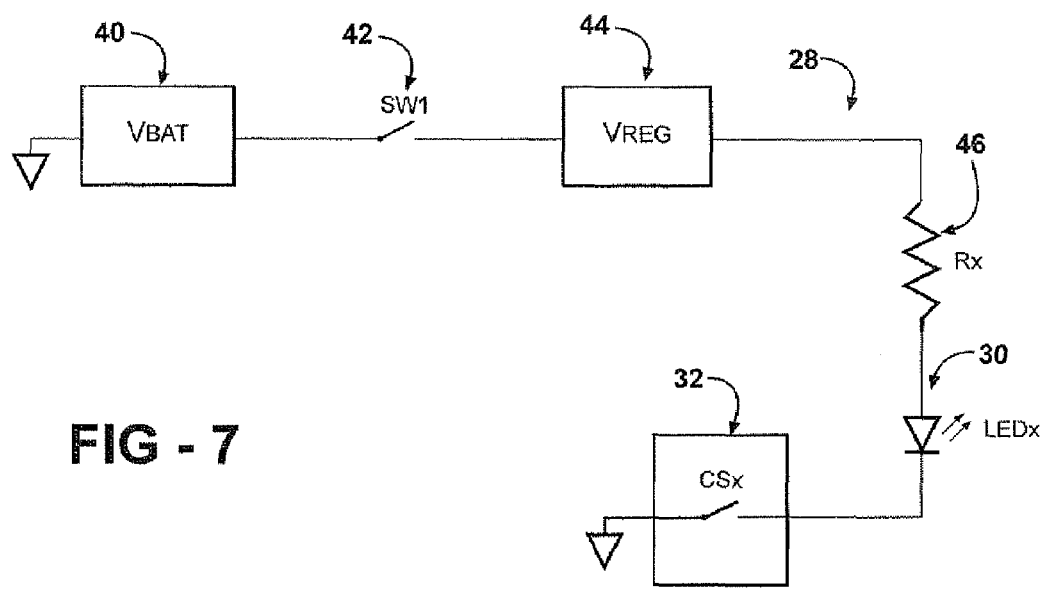
FIG. 7 is a simplified electrical block diagram of the fixture according to one embodiment of the invention.

Referring now to FIGS. 1, 6 and 7, a contact alignment tool 20 for aligning the contacts 14 includes a body 22 to be positioned relative to the testing machine 10 such that the body 22 can be arcuately indexed along a path 24 to a contact alignment test position 26 proximate the contacts 14 of the test module 12. A plurality of circuits 28 is associated with the body 22. Each circuit 28 includes at least one output signal connection 30 and at least one open contact station 32. Each open contact station 32 is defined by at least one open circuit trace pattern 34, 34a, 34b, 34c, (FIGS. 2A-2C), such that each open contact station 32 will be closed by the contacts 14 when the body 22 is located at the contact test position 26 proximate the contacts 14 and the contacts 14 are properly aligned as best seen in FIG. 3A-5C.

Figure 2A:
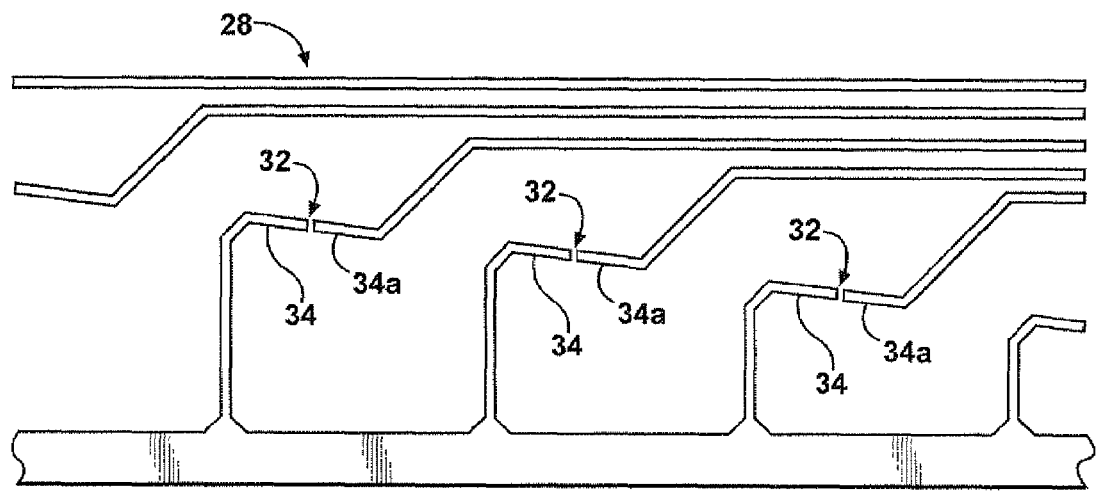
FIGS. 2A-2C are plan views of a general printed circuit board (PCB) trace layout according to one embodiment of the invention.
Figure 2B:
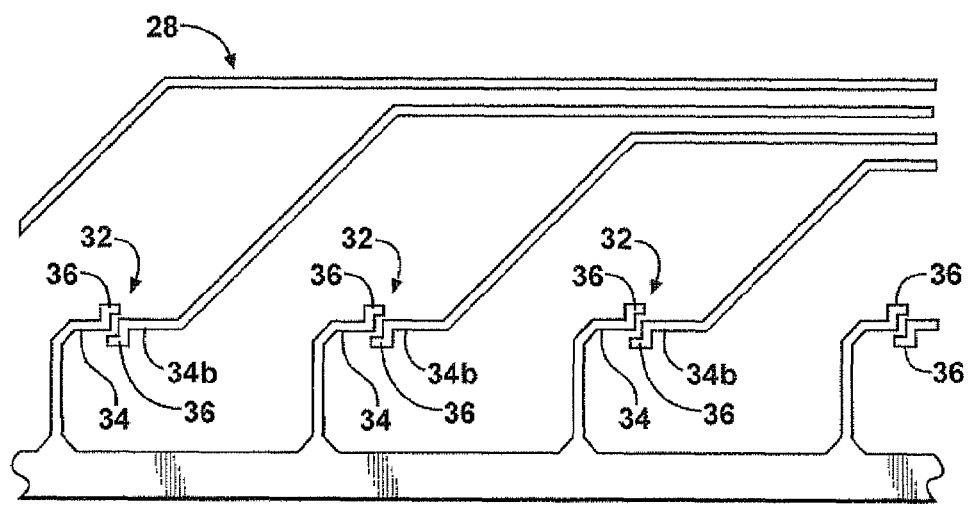
Figure 2C:
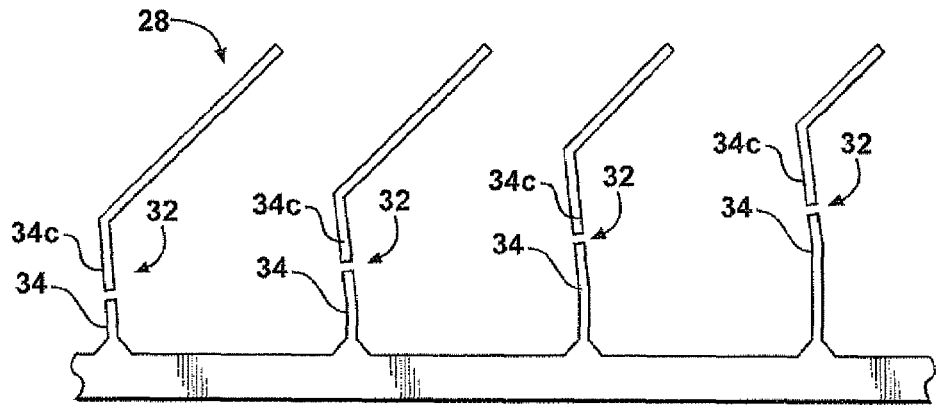

Referring now to FIGS. 2A-2C, the at least one open contact station 32 can include at least one trace pattern 34a providing a rough alignment of the contacts 14, at least one trace pattern 34b providing a medium alignment of the contacts 14, and at least trace pattern 34c providing a fine alignment of the contacts 14. The path 24 can be arcuate and the trace pattern 34a for rough alignment of the contacts 14 can be positioned substantially orthogonal to the arcuate path. The trace pattern 34b for medium alignment of the contacts 14 can include lifting tabs 36 positioned within the arcuate path 24. The trace pattern 34c for fine alignment of the contacts 14 can be positioned within the arcuate path 24.

Referring now to FIG. 7, the alignment circuitry 28 is powered by an onboard battery 40 through an on/off switch 42 for controlling power from the at least one battery 40 to the plurality of circuits 28. A voltage regulator 44 provides a steady voltage reference to the at least one output signal connection 30. The at least one output signal connection 30, by way of example and not limitation, can include a light emitting diode (LED), a set of contacts, or a connector to another device, such as a computer, processor, or the like. The voltage regulator 44 is optional provided that the current limiting resistor 46 is appropriately sized. Contact stations 32 are precision spaced printed circuit board traces 34a, 34b, 34c that act as an open switch to be closed when the adjustable contact 14 shorts the open circuit 34. The printed circuit board traces are gold plated to resist printed circuit board trace oxidation. The body 22 can include three contact stations 32 with eight circuits 28 each; however, the number of contact stations and circuits can be varied as required for different setups depending on the contact arrangement.

Referring again to FIG. 1, the body 22 can include a plurality of check apertures 48 configured to align with a plurality of blow-off apertures 50 (FIG. 6) located on the electronic component testing machine 10. The body 22 can be tab-shaped.

Referring now to FIGS. 2A and 3A-3C, each contact 14 operably engages at least one trace pattern 34, 34a providing a rough alignment of the contacts 14 as the body 22 is indexed along the path 24 to a contact alignment test position 26 proximate the contacts 14 of the test module 12 of the electronic testing machine 10. The trace pattern 34, 34a for rough alignment of the contacts 14 is positioned substantially orthogonal to the arcuate path 24 as best seen in FIG. 3A.

Referring to now to FIGS. 2B and 4A-4C, each contact 14 operably engages at least one trace pattern 34, 34b providing a medium alignment of the contacts 14 as the body 22 is indexed along the path 24 to a contact alignment test position 26. The trace pattern 34, 34b for fine alignment of the contacts 14 Include lifting tabs 36 positioned within the arcuate path 24 as best seen in FIG. 4A.

Referring to now to FIGS. 2C and 5A-5C, each contact 14 operably engages at least one trace pattern 34, 34c providing a fine alignment of the contacts 14 as the body 22 is indexed along the path 24 to a contact alignment test position 26 proximate the contacts 14 of the test module 12 in the electronic testing machine 10. The trace pattern 34, 34c for fine alignment of the contacts 14 is positioned within the arcuate path 24 as best seen in FIG. 5A.

A process or method for aligning contacts 14 on an electronic testing machine 10 having at least one test module 12 with a plurality of contacts 14 can include attaching a body 22 relative to the testing machine 10. The body 22 can include at least one open contact station 32 having at least one trace pattern 34 extending between an output signal connection 30 and a power source 40. The alignment process indexes the body 22 along the path 24 to contact alignment position 26 proximate the at least one test module 12 having a plurality of contacts 14 to be tested. In the event that output signal connection 30 does not energize when the body 22 is indexed to the contact alignment test position 26 proximate the at least one test module 12 having the plurality of contacts 14 to be tested, the alignment process adjusts alignment of the at least one test module 12 having the plurality of contacts 14 to be tested so that more output signal connections 30 do energize.

The indexing process can include positioning the at least one open contact station 32 associated with the body 12 in the contact test position 26. The at least one open contact station 32 can include one trace pattern 34, 34a providing a rough alignment measurement of the contacts 14, at least one trace pattern 34, 34b providing a medium alignment measurement of the contacts 14, and at least one trace pattern 34, 34c providing a fine alignment of the contacts 14. The alignment process can index the body 22 through an arcuate path 24 and when properly located at contact alignment test position, measure rough alignment with the position trace pattern 34a for rough alignment measurement with the contacts 14 located substantially orthogonal to the arcuate path 24. Medium alignment can be measured with the positioned trace pattern 34, 34b for medium alignment measurement of the contacts 14 with lifting tabs 36 located within the arcuate path 24. Fine alignment measurement can be taken with the position trace pattern 34, 34c for fine alignment measurement of the contacts 14 located within the arcuate path 24.

The alignment process can include powering the at least one open contact station 32 with at least one battery 40, and controlling connection of the at least one battery 40 to the at least one open contact station 32 with at least one on/off switch 42 associated with the at least one battery 40. A plurality of check apertures 48 associated with the body 22 can be aligned with a plurality of blow-off apertures 50 located on the electronic component testing machine 10.

Referring now to FIG. 6, the adjusting process can include turning at least one adjustment set screw 52a, 52b to move the contacts 14 into proper alignment and to energize more output signal connections 30 (FIG. 1). Turning at least one adjustment set screw 52a, 52b can move the contacts 14 in at least of one of a radial direction 54 and an orthogonal direction 56 with respect to the radial direction 54.

A fixture 20 according to an embodiment of the invention allows easy alignment of adjustable contacts 14 in MLCC tester equipment 10 without the need for MLCCs in situ. Multiple stations 12 can be aligned using predetermined patterns designed for radial, theta, and/or X/Y-axis positioning. The fixture 20 uses a single sided printed circuit board (PCB) assembly to determine when the adjustable contacts 14 are properly aligned. Precision PCB open circuit trace patterns 34, 34a, 34b, 34c illuminate light emitting diodes (LED) 30 signifying proper alignment when the open circuit is shorted together (a switch closure) by the aligned contact 14.

By way of example and not limitation, suitable alignment circuitry 28 can be provided as illustrated in FIG. 7. The alignment circuitry 28 can be powered by at least one onboard battery VBAT 40 through an ON/OFF switch SW1 42. Voltage regulator VREG 44 provides a steady voltage reference to the LED circuits LEDx 30 and Rx 46. The voltage regulator 44 is optional provided that the current limiting resistor Rx 46 is appropriately sized. Contact stations CSx 32 are precision spaced PCB traces 34, 34a, 34b, 34c that act as an open switch to be closed when the adjustable contact 14 shorts the open circuit. The PCB traces 34, 34a, 34b, 34c are gold plated to resist PCB trace oxidation. One embodiment of the present invention uses three contact stations 32 with eight circuits each, however it should be recognized that this illustrated configuration does not preclude differing setups depending on the contact arrangement.

An embodiment of the PCB of body 22 (also called PCB 22) is illustrated, by way of example and not limitation in FIGS. 2A, 2B and 2C. The illustrated PCB 22 is designed for a radially positioned contact 14 system. All shown features are precisely machined or fabricated on the PCB 22. The drive shaft aperture 58 is centered about the rotation axis. The rectangular drive pin slot 60 allows the fixture to be rotated about the rotation axis at increments commanded by the MLCC tester 10 algorithm. Manufacturing alignment apertures 62 guide secondary PCB machining of the rectangular drive pin slot 60 and drive shaft aperture 58. The position reference apertures 62 are drilled at PCB 22 at manufacture and allow the tool or fixture 20 to be referenced to the fixed contact 14 positions. The various circuit patterns 32 explained in the following paragraph allow the adjustable contacts 14 to be aligned for different positioning configurations. The PCB 22 thickness is adjusted at manufacture to match MLCC dimensions.

FIGS. 3A-5C illustrate roller contact 14 alignment pattern geometry with three different PCB 22 trace patterns 34, 34a, 34b, 34c. Alignment precision is determined by the trace width, trace gap, trace height, and adjustable contact width. FIG. 3A-5C depicts the adjustable contact 14 as a roller wheel. In the diagram of FIGS. 3A-3C, general theta positioning is determined by the trace width while radial positioning is constrained by the gap. In the diagram of FIGS. 4A-4C, the whole contact 14 is elevated to the same height to eliminate the wheel offset shown in FIG. 3C. Thus, precise theta positioning can be determined depending on the trace width. In the diagram of FIGS. 5A-5C, general theta is again determined by the trace gap.

The fixture 20 allows precision MLCC contact 14 alignment using a self-contained tool without the need for in situ components or optical viewing elements. Alignment features are fabricated and/or machined on readily available PCB materials. The tool 20 can be used with initial setup and/or verification of alignment during the manufacturing process.

An upper contact alignment verification tool 20 according to one embodiment of the invention features a tool 20 that can be used to verity alignment of upper contacts 14. The tool 20 can be used to adjust alignment of each upper contact 14. The tool 20 is composed of three banks 64, 66, 68 of eight LEDs 30 representing individual upper contacts 14 of a station 12. Each bank of LEDs is designed to represent different tolerance of alignment. By way of example and not limitation, the first bank 64 of LEDs represent tolerance: +/−5 mil in theta direction, +/−10 mil in radial direction; the middle bank 66 of LEDs represent tolerance: +/−15 mil in theta direction, +/−10 mil in radial direction; and the last bank 68 of LEDs represent tolerance; +/−1 mil in theta direction, +/−25 mil in radial direction. The tool 20 includes two sets 70, 72 of home verification apertures 48 located between the first, middle, and last banks 64, 66, 68 to be aligned with blow-off apertures 50 associated with each contact module 12 to be tested, A power switch 42 is provided to turn the circuit 28 on and off. By way of example and not limitation, the maximum power consumption can be 1 mA when all twenty-four LEDs 30 are turned on, and the battery 40 can have an estimated storage life of 4 years when the power switch 42 is turned off.

By way of example and not limitation, the following is an exemplary set of step by step operating instruction for one embodiment of the invention. During preparation for performing an alignment process, turn the power switch 42 on to check if the battery 40 is still in operating condition. Move the test plate 22 to a "home" location. Verify the blow off apertures 48 are properly aligned with the chip pocket. During alignment verification, install the tool 20 on to the drive shaft, verify "home" location, index the tool 20 and monitor LEDs 30 as the tool 20 rotates. If LEDs 30 do not light inbetween lit LEDs 30, the alignment is considered to be good, since the outside contacts 14 are aligned correctly. All eight LEDs 30 in the middle bank 66 should turn on when the middle bank pattern is under the module or station 12. The goal is to see as many LEDs 30 turned on as possible when the tool 20 indexes. During the upper contact adjustment, make sure the upper contact mount is correctly leveled and aligned. Verify alignment of each upper contact module as described above. Record each alignment value for each station 12 by LED status as the tool 20 rotates. An operator can use a predefined check sheet, if desired.

Index the tool 20 until the first bank 64 pattern moves under the first upper contact station 12. First, try to turn on as many first bank 64 LEDs 30 as possible by adjusting the contacts 14 of the target station 12 on the first pattern. However, even one or two illuminated LEDs may be good enough. It is not necessary to spend too much time and effort during this stage of adjustment. This is a very sensitive adjustment operation. Adjust "theta" and "radial" position of upper contacts 14 while monitoring LEDs 30. Turning the "theta" adjustment set screw 52b clockwise will move the contacts forward. Turning the "radial"adjustment set screw 52a clockwise will move the contacts outside. If the LED 30 light moves from Track 1 to 8 or 8 to 1 as the "theta" adjustment is made, that station may need yaw adjustment. "Yaw" adjustment should be performed off the machine on a setup fixture. Index four steps to move the middle bank 66 pattern under the target station 12. Fine tune the target station 12 to turn on all LEDs 30 in the middle bank 66. It is allowable to have some LEDs 30 off located between LEDs 30 that are illuminated. Repeat steps above all the way to the last station 12. The last bank 68 of LEDs 30 is for reference only. This is useful to see if there is any radial shift issue.

While the invention has been described in connection with what is presently considered to be the most practical and preferred embodiment, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. In an electronic testing machine including at least one test module having a plurality of contacts for testing electronic components, the improvement of a contact alignment tool for aligning the contacts comprising:

a body to be positioned relative to the testing machine such that the body can be radially indexed along a path to a contact alignment test position proximate the contacts of the test module; and a plurality of circuits associated with the body, each circuit including at least one output signal connection and at least one open contact station, each open contact station defined by at least one open circuit trace pattern, such that each open contact station will be closed by the contacts when the body is located at the contact test position proximate the contacts and the contacts are properly aligned; wherein the at least one open contact station includes:

a first trace pattern positioned on the body relative to the path and including a trace width, a trace gap and a trace height;

a second trace pattern positioned on the body relative to the path and including at least one of a trace width, a trace gap and a trace height different from that of the first trace pattern; and a third trace pattern positioned on the body relative to the path and including at least one of a trace width, a trace gap and a trace height different from that of the first trace pattern and at least one of the trace width, the trace gap and the trace height different from that of the second trace pattern.

2. The improvement of claim 1 wherein the path is arcuate and the first trace pattern is positioned substantially orthogonal to the arcuate path.

3. The improvement of claim 1 wherein the path is arcuate and the second trace pattern includes lifting tabs positioned within the arcuate path.

4. The improvement of claim 1 wherein the path is arcuate and the third trace pattern is positioned within the arcuate path.

5. The improvement of claim 1 further comprising at least one battery for powering the plurality of circuits, and at least one on/off switch associated with the at least one battery for controlling power to the plurality of circuits.

6. The improvement of claim 1, wherein the body includes a plurality of check apertures configured to align with a plurality of blow off apertures located on the electronic component testing machine.

7. The improvement of claim 1, wherein the body is tab shaped.

8. A contact alignment tool for aligning test contacts in an electronic testing machine including at least one test module having a plurality of contacts for testing electronic components, the contact alignment tool comprising:
a body to be positioned relative to the testing machine such that the body radially indexes along a path to a contact alignment test position proximate the contacts of the test module; and
a plurality of circuits associated with the body, each circuit including at least one output signal connection and at least one open contact station, each open contact station defined by at least one open circuit trace pattern, such that the open contact station will be closed by the contacts when the body is located at the contact alignment test position proximate the contacts and the contacts are properly aligned; wherein
the at least one open contact station includes:
a first trace pattern positioned on the body relative to the path and including a trace width, a trace gap and a trace height;
a second trace pattern positioned on the body relative to the path and including at least one of a trace width, a trace gap and a trace height different from that of the first trace pattern; and
a third trace pattern positioned on the body relative to the path and including at least one of a trace width, a trace gap and a trace height different from that of the first trace pattern and at least one of the trace width, the trace gap and the trace height different from that of the second trace pattern.

9. The contact alignment tool of claim 8 wherein the path is arcuate and the first trace pattern is positioned substantially orthogonal to the arcuate path.

10. The contact alignment tool of claim 8 wherein the path is arcuate and the second trace pattern includes lifting tabs positioned within the arcuate path.

11. The contact alignment tool of claim 8 wherein the path is arcuate and the third trace pattern is positioned within the arcuate path.

12. The contact alignment tool of claim 8 further comprising at least one battery for powering the plurality of circuits and at least one on/off switch associated with the at least one battery for controlling power to the plurality of circuits.

13. The contact alignment tool of claim 8, wherein the body includes a plurality of check apertures configured to align with a plurality of blow off apertures located on the electronic component testing machine.

14. The contact alignment tool of claim 8, wherein the body is tab shaped.

15. A method for aligning contacts of an electronic testing machine including at least one test module having a plurality of contacts, the method comprising:
attaching a body relative to the testing machine, the body including at least one open contact station having at least one trace pattern extending between an output signal connection and a power source;
indexing the body along a path to a contact alignment test position proximate the at least one test module having a plurality of contacts to be tested, the indexing further comprising:
positioning the at least one open contact station associated with the body in the contact test position, the at least one open contact station including:
a first trace pattern positioned on the body relative to the path and including a trace width, a trace gap and a trace height;
a second trace pattern positioned on the body relative to the path and including at least one of a trace width, a trace gap and a trace height different from that of the first trace pattern; and
a third trace pattern positioned on the body relative to the path and including at least one of a trace width, a trace gap and a trace height different from that of the first trace pattern and at least one of the trace width, the trace gap and the trace height different from that of the second trace pattern; and
in the event that the output signal connection does not energize when the body is indexed to the contact alignment test position proximate the at least one test module having the plurality of contacts to be tested, adjusting alignment of the at least one test module having the plurality of contacts to be tested so that the output signal connection does energize.

16. The method of claim 15 wherein the path is arcuate and the positioning step further comprises:
measuring rough alignment with the positioned trace pattern for rough alignment measurement of the contacts located substantially orthogonal to the arcuate path.

17. The method of claim 15 wherein the path is arcuate and the positioning step further comprises:
measuring medium alignment with the positioned trace pattern for medium alignment measurement of the contacts with lifting tabs located within the arcuate path.

18. The method of claim 15 wherein the path is arcuate and the positioning step further comprises:
measuring fine alignment with the positioned trace pattern for fine alignment measurement of the contacts located within the arcuate path.

19. The method of claim 15 further comprising:
powering the at least one open contact station with at least one battery; and
controlling connection of the at least one battery to the at least one open contact station with at least one on/off switch associated with the at least one battery.

20. The method of claim 15 further comprising:
aligning a plurality of check apertures associated with the body with a plurality of blow off apertures located on the electronic component testing machine.

21. The method of claim 15, wherein the adjusting step further comprises:
turning at least one adjustment set screw to move the contacts into proper alignment and to energize more output signal connections.

22. The method of claim 21, wherein the turning step further comprises:
moving the contacts in at least one of a radial direction and an orthogonal direction with respect to the radial direction.

* * * * *